United States Patent
Ku

(10) Patent No.: US 6,519,199 B2
(45) Date of Patent: Feb. 11, 2003

(54) SEMICONDUCTOR MEMORY DEVICE

(75) Inventor: Kie-Bong Ku, Ichon-shi (KR)

(73) Assignee: Hynix Semiconductor Inc., Seoul (KR)

( * ) Notice: Subject to any disclaimer, the term of this patent is extended or adjusted under 35 U.S.C. 154(b) by 0 days.

(21) Appl. No.: 09/896,015

(22) Filed: Jun. 28, 2001

(65) Prior Publication Data

US 2002/0001248 A1 Jan. 3, 2002

(30) Foreign Application Priority Data

Jun. 29, 2000 (KR) ............................................. 00-36407

(51) Int. Cl.⁷ ................................................ G11C 7/00
(52) U.S. Cl. .............. 365/222; 365/189.05; 365/230.06
(58) Field of Search ........................... 365/222, 230.03, 365/230.06, 230.04, 189.05

(56) References Cited

U.S. PATENT DOCUMENTS 6,246,631 B1 * 6/2001 Park ............................ 365/222
6,272,631 B1 * 8/2001 Thomlinson et al. ....... 713/155
6,327,204 B1 * 12/2001 Kook et al. ................. 365/207

* cited by examiner

*Primary Examiner*—Richard Elms
*Assistant Examiner*—Hien Nguyen
(74) *Attorney, Agent, or Firm*—Townsend and Townsend and Crew LLP

(57) ABSTRACT

A semiconductor memory device of the present invention is capable of reducing self-refresh current by preventing bit line separation signal (BISH/BISL) toggling when word lines in the same block are enabled/disabled. The semiconductor memory device has a cross area between a plurality of sense amplifier blocks and includes a self-refresh and internal address detector receiving a multiplicity of internal addresses and a self-refresh signal for generating a signal determining whether bit line separation signals are to be toggled; a block selecting signal latch for latching the output signal of the self-refresh and internal address detector and a block selecting signal; and a BISH/BISL controller receiving the output signals of the block selecting signal latch for generating the bit line separation signals, wherein the cross area between the sense amplifier blocks includes a bit line separation driver controlled by the bit line separation signals.

19 Claims, 6 Drawing Sheets

TOGGLING

SEMICONDUCTOR MEMORY DEVICE

CROSS REFERENCES TO RELATED APPLICATIONS

This application claims priority from Korean Application, entitled "Semiconductor Memory Device" Application No. 2000-36407, filed on Jun. 29, 2000 and incorporates by references its disclosure for all purposes.

BACKGROUND OF THE INVENTION

1. Field of the Invention

The present invention relates to a semiconductor memory device that prevents bit line separation signals from toggling, and, more particularly, to a semiconductor memory device that prevents bit line separation signals from toggling when word lines in the same block are enabled/disabled to, thereby reducing self-refresh current to minimize power consumption and improve the integrity of timing signals.

2. Prior Art of the Invention

FIG. 1 is a diagram showing conventional toggling of bit line separation signals (BISH/BISL). In conventional BISH/BISL toggling, BISH/BISL have three levels. The BISH/BISL an internal voltage level (VINT) when the word lines are not active (i.e., disabled), and the BISH/BISL corresponding to a selected block within an active bank have a power voltage level VPP and a ground voltage level VSS. When the word lines are disabled and thus not active, the BISH/BISL transitions to internal voltage VINT from either a level of VPP or VSS. When another block is active and its associated word lines are enabled, the BISH/BISL corresponding to that block transitions to power voltage VPP and ground voltage VSS. On the other hand, the BISH/BISL corresponding to unselected blocks (i.e., not active) remain steady at the internal voltage VINT level.

If the word lines are sequentially enabled, the corresponding BISH/BISL is toggled whenever one of the word lines is disabled, and current is consumed. Furthermore, since a conventional BISH/BISL driver drives the three levels, it burdens the complexity of the device design and layout. This is especially the case if such the conventional driver is disposed between sense amplifier blocks (i.e., within a cross area). The generation of the internal voltage VINT line also places a burden on the layout. As a result, the BISH/BISL load in conventional memories is too large, or too heavy, to effectively drive at the same time, which detrimentally affects tRCD (e.g., RAS to CAS DELAY TIME).

SUMMARY OF THE INVENTION

Therefore, the present invention provides a semiconductor memory device capable of reducing the self-refresh cycle current by preventing BISH/BISL toggling when word lines in the same block are enabled/disabled.

In accordance with an embodiment of the present invention, there is provided a semiconductor memory device having a cross area between a plurality of sense amplifier blocks, the memory device comprising: a self-refresh and internal address detector configured to receive a multiplicity of internal addresses and a self-refresh signal, for generating a signal determining whether bit line separation signals are to be toggled; a block selecting signal (MSI) latch for latching the output signal of the self-refresh and internal address detector and a block selecting signal; and a BISH/BISL controller receiving the output signals of the block-selecting signal latch to generate bit line separation signals, wherein the cross area between the sense amplifier blocks includes a bit line separation driver controlled by the bit line separation signals.

BRIEF DESCRIPTION OF THE DRAWINGS

The above and other features of the present invention will become apparent from the following description of preferred embodiments, taken in conjunction with the accompany drawings, in which.

DETAILED DESCRIPTION OF THE PREFERRED EMBODIMENTS

Figure 1:
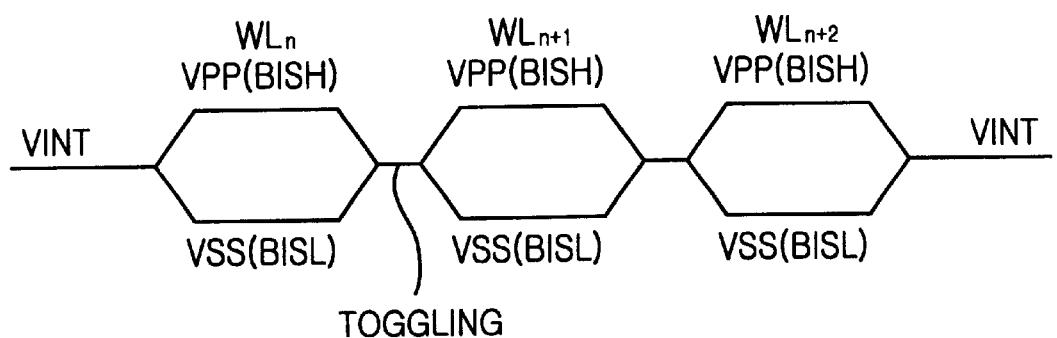
FIG. 1 is a diagram showing a conventional BISH/BISL toggling.
Figure 2:
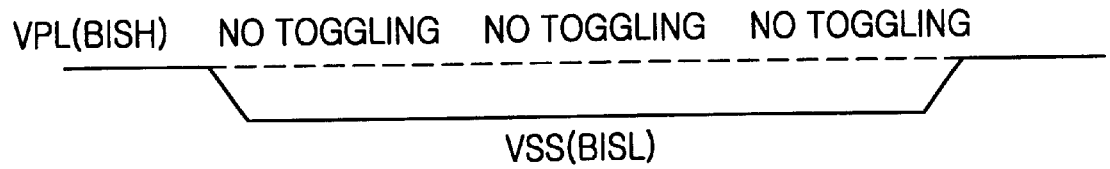
FIG. 2 is a diagram of BISH/BISL toggling in accordance with the present invention.
Figure 3:
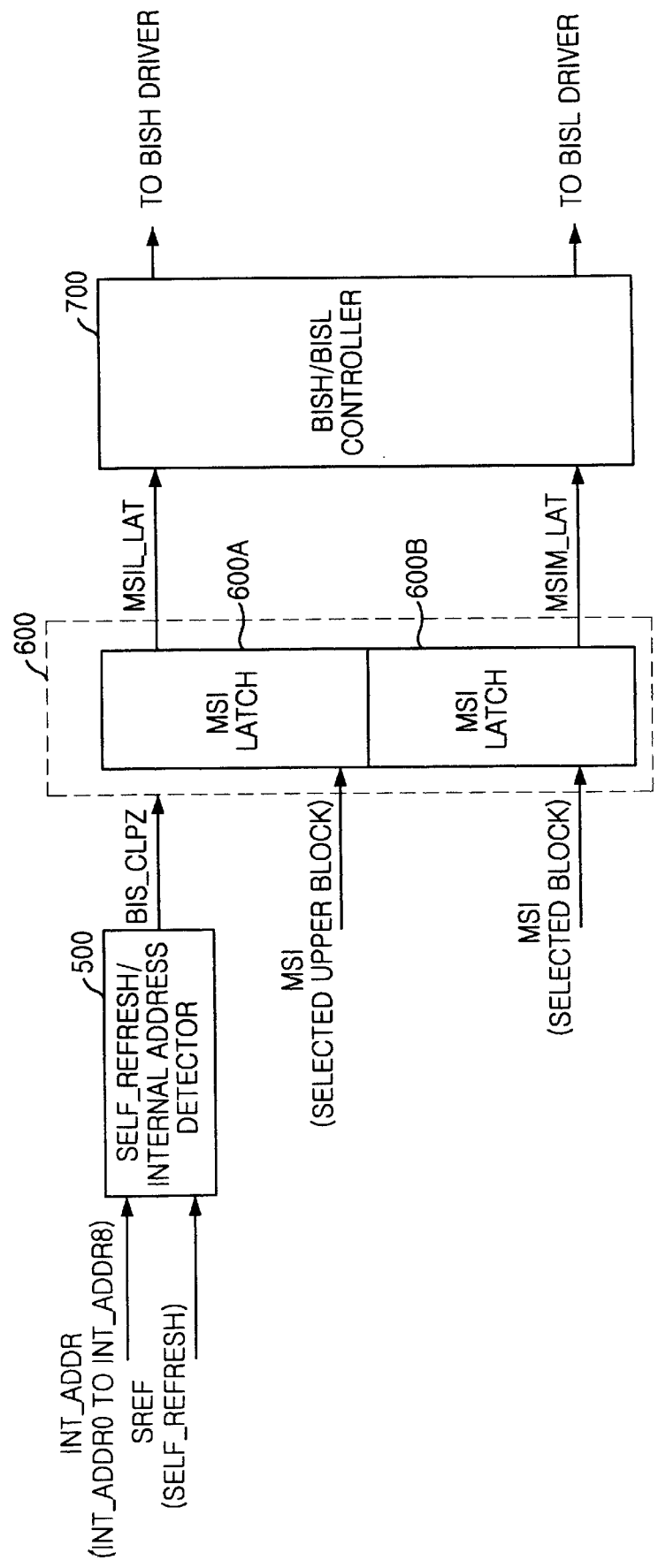
FIG. 3 is a block diagram of an apparatus for preventing BISH/BISL toggling in accordance with one embodiment of the present invention.

FIG. 2 shows a BISH/BISL toggling in accordance with the present invention, and FIG. 3 is a block diagram of a semiconductor memory device preventing bit line separation signals (BISH/BISL) from toggling, in accordance with the present invention.

Referring to FIGS. 2 and 3, a semiconductor memory device capable of preventing the BISH/BISL toggling, comprises a self-refresh and internal address detector 500, a block selecting signal (MSI) latch 600 including a first MSI latch 600A and a second MSI latch 600B, and a BISH/BISL controller 700.

Detector 500 generates a signal for determining whether BISH/BISL will be toggled by using a number of internal addresses INT_ADDR0 to INT_ADDR8, for example, and a self-refresh signal SREF for self-refresh operation mode. MSI latch 600 latches the output signal BIS_CLPZ of detector 500 and a block selecting signal (MSI). The BISH/BISL controller 700 receives the exemplary output signals MSIL_LAT, MSIM_LAT of MSI latch 600 to generate the BISH/BISL.

Figure 4:
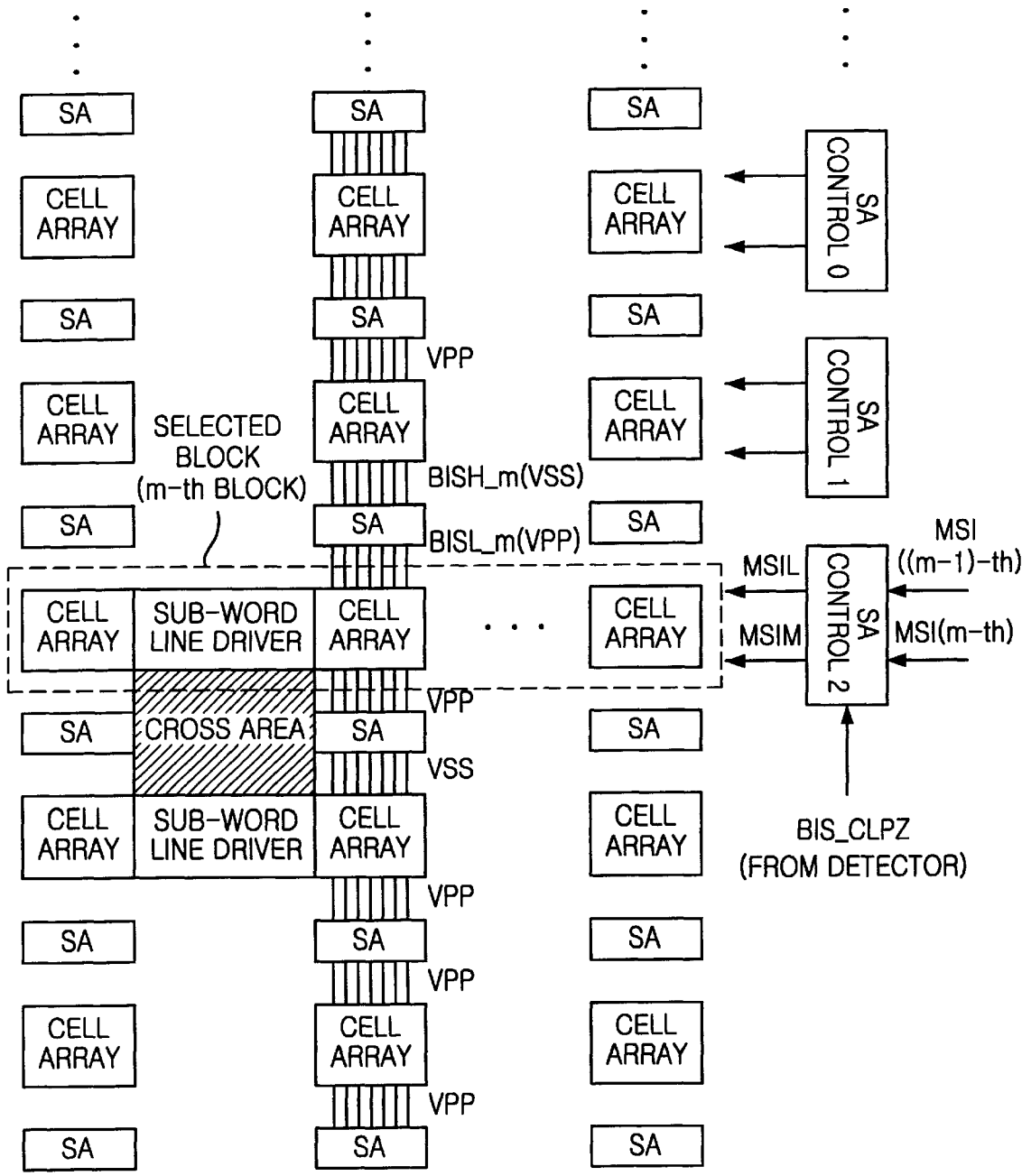
FIG. 4 is a diagram of the operation of BISH/BISL (VPP-VSS)

FIG. 4 is a block diagram of an exemplary layout of the semiconductor device operating with BISH/BISL (VPP-VSS), in which BISH/BISL toggling is prevented when the word lines are sequentially accessed.

As shown in FIG. 4, a bank includes a multiplicity of blocks, each block having a plurality of cell arrays. A sub-word line driver is disposed between the cell arrays and a BISH/BISL driver is disposed in a cross area between sense amplifier blocks.

Figure 5:
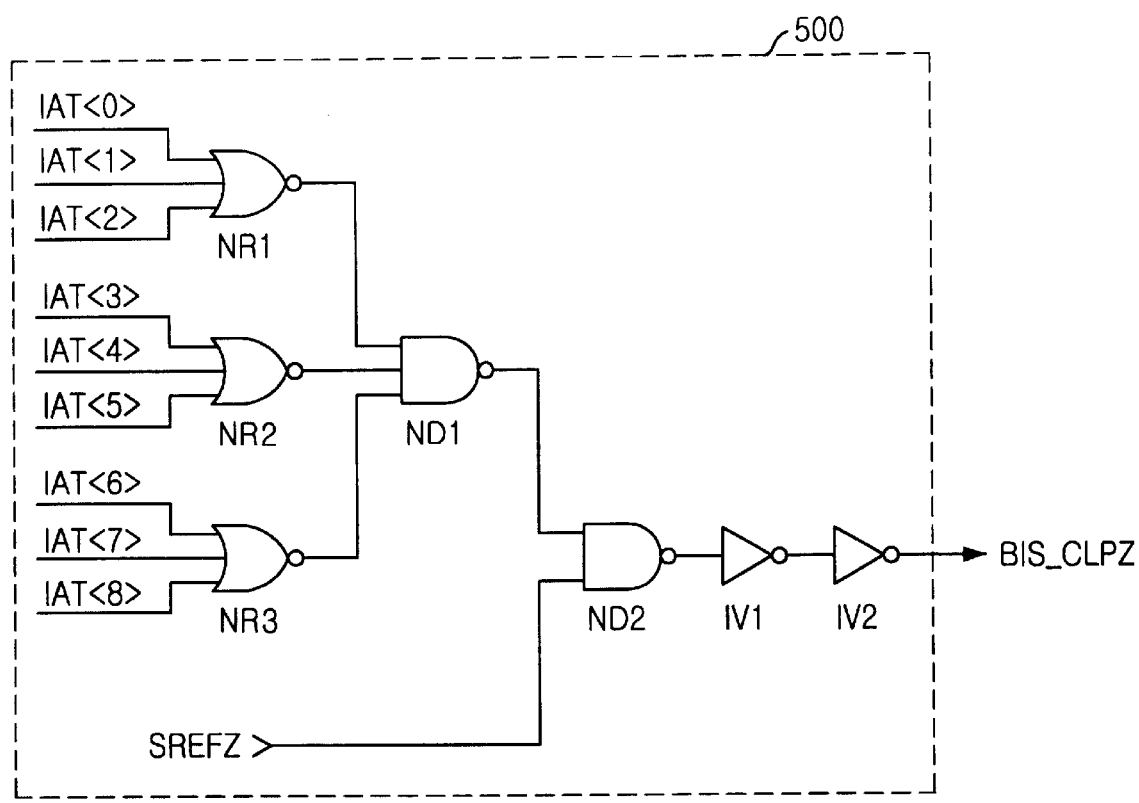
FIG. 5 is a circuit diagram of a self-refresh and internal address detector in accordance with the present invention.

FIG. 5 illustrates a circuit diagram of the self-refresh and internal address detector 500 of FIG. 3. In one embodiment, detector 500 includes a NOR gate NR1 for logically combining the internal addresses IAT<0>, IAT<1>, IAT<2>; a NOR gate NR2 for logically combining the internal addresses IAT<3>, IAT<4>, IAT<5>; a NOR gate NR3 for logically combining the internal addresses IAT<6>, IAT<7>, IAT<8>; a NAND gate ND1 for logically combining the outputs of NOR gates NR1, NR2, NR3; a NAND gate ND2 for logically combining the self-refresh signal SREFZ and the output of NAND gate ND1; an inverter IV1 for inverting the output of NAND gate ND2; and an inverter IV2 for inverting the inverter IV1.

Detector 500 receives a self-refresh signal SREFZ representing a self-refresh mode and internal addresses IAT<0:8> to generate a signal BIS_CLPZ for determining whether to toggle the BISH/BISL.

Because the self-refresh signal SREFZ is low in a non-self-refresh mode, the output signal BIS_CLPZ of detector 500 is high so as to toggle the BISH/BISL. In a self-refresh mode, the output signal BIS_CLPZ of detector 500 is high only when the internal addresses IAT<0:8> are all low, and only then is the BISH/BISL toggled.

When all the internal addresses IAT<0:8> are in a low state, $2^9=512$ rows in the same block are sequentially accessed and then the first word line of the next block is accessed. That is, the change of blocks is detected at that state.

Figure 6:
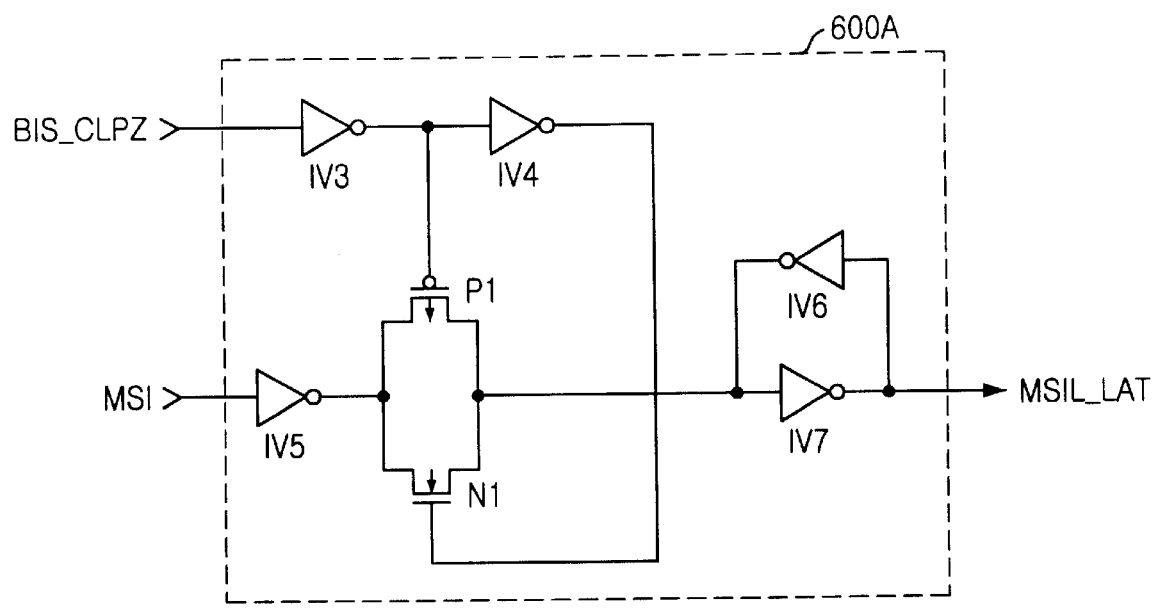
FIG. 6 is a circuit diagram of an MSI latch in accordance with the present invention.

FIG. 6 is a circuit diagram of an MSI latch of FIG. 3. As shown in FIG. 6, exemplary first MSI latch 600A includes a first inverter IV3 for inverting the output signal BIS_CLPZ of detector 500; a second inverter IV4 for inverting the output of inverter IV3; a third inverter IV5 for inverting the output of a block selecting signal MSI; a transfer gate P1 having a gate coupled to the output of inverter IV3; a transfer gate N1 having a gate coupled to the output of inverter IV4; and latch circuits IV6, IV7 using inverters and receiving the outputs of the transfer gates P1, N1, for outputting the block selecting signal. Second MSI latch 600B is similarly configured to first MSI latch 600A.

If output signal BIS_CLPZ of detector 500 is high, block selecting signal MSI is passed through the transfer gates P1, N1 and latched using IV6 and IV7. As shown in FIGS. 3 and 6, the first MSI latch 600A is configured to provide the MSIL_LAT blocking signal at the output of MSI latch 600. On the other hand, if the output signal BIS_CLPZ of detector 500 is low, block selecting signal MSIL_LAT remains at a state last latched while BIS_CLPZ was previously high. Also, the second MSI latch 600B is configured to provide the MSIM_LAT blocking signal at the output of MSI latch 600.

In another embodiment of MSI latch 600, latch 600 is operably disposed within a sense amp control block, such as SA CONTROL 2 of FIG. 4, wherein MSIL and MSIM are provided to the selected m-th block.

Figure 7:
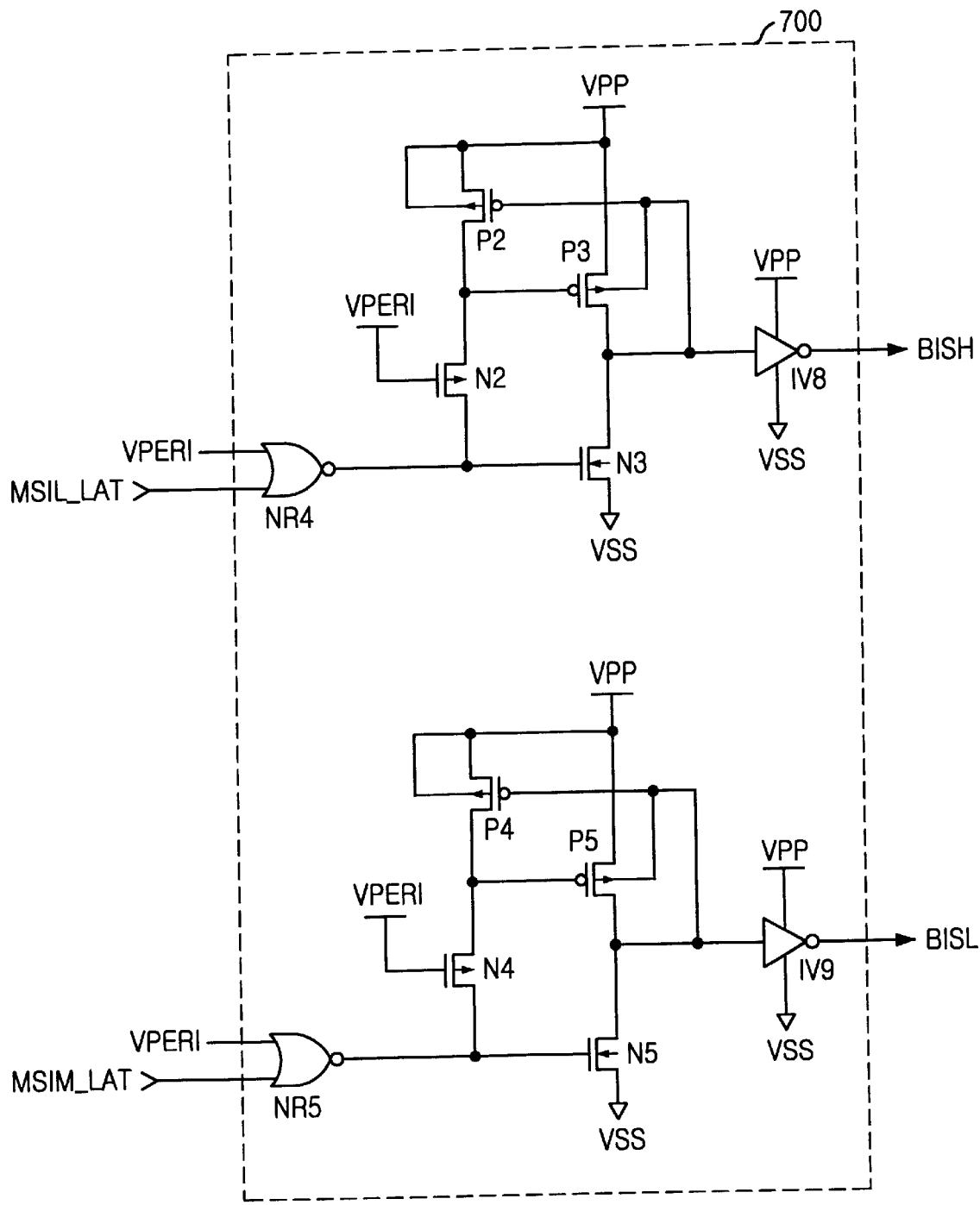
FIG. 7 is a circuit diagram of a BISH/BISL controller, in accordance with the present invention.

FIG. 7 is a circuit diagram of exemplary BISH/BISL controller 700 of FIG. 3, in accordance with the present invention. As shown in this figure, BISH/BISL controller 700 includes NOR gate NR4 for logically combining the block selecting signal MSIL_LAT and a peripheral circuit voltage VPERI generated by an on-chip voltage generator (not shown). The use of peripheral circuit voltage is, for example, a generated voltage for, among other things, compensating for fluctuations in a threshold voltage of a device. Use of peripheral voltage is well known in the art and its functionality should be apparent to one having ordinary skill in the art.

Controller 700 also includes an NMOS transistor N2 having a source terminal coupled to the output of NOR gate NR4 and a gate terminal coupled to the peripheral circuit voltage VPERI. Controller 700 has a PMOS transistor P2 having a drain terminal coupled to the drain terminal of the NMOS transistor N2 and a back gate (e.g., body or substrate) terminal of P2 and a source terminal coupled to the power voltage VPP. A PMOS transistor P3 having a gate terminal is coupled between the drain terminal of the NMOS transistor N2 and the drain terminal of the PMOS transistor P2. The back gate terminal and source terminal of P3 are coupled to the power voltage VPP. An NMOS transistor N3 having a gate terminal coupled to the output of the NOR gate NR4 has its drain terminal coupled to the drain terminal of the PMOS transistor P3 and a source terminal coupled to the ground voltage VSS. An inverter IV8 is coupled between the drain terminal of PMOS transistor P3 and the drain terminal of NMOS transistor N3 to provide a bit line separation signal BISH at the output of controller 700.

BISH/BISL controller 700 further includes a NOR gate NR5 for logically combining the block selecting signal MSIM_LAT and the peripheral circuit voltage VPERI. Controller 700 includes an NMOS transistor N4 having a source terminal coupled to the output of the NOR gate NR5 and a gate terminal coupled to the peripheral circuit voltage VPERI. A PMOS transistor P4 has a drain terminal that is coupled to the drain terminal of the NMOS transistor N4 and a back gate terminal and a source terminal coupled to the power voltage VPP.

Controller 700 also includes a PMOS transistor P5 having a gate terminal coupled between the drain terminal of NMOS transistor N4 and the drain terminal of PMOS transistor P4. A back gate of P4 is coupled to the source terminal of P4 and is further coupled to the power voltage VPP. An NMOS transistor N5 having a gate terminal coupled to the output of the NOR gate NR5. Transistor N5 also includes a drain terminal coupled to the drain terminal of the PMOS transistor P5 and a source terminal coupled to the ground voltage VSS. An inverter IV9 is coupled to the drain terminal of PMOS transistor P5 and the drain terminal of NMOS transistor N5 to output bit line separation signal BISL. Exemplary BISH/BISL controller 700 thus operates such that when the m-th block is selected, the block selecting signal MSIM_LAT is high, BISL is low, and BISH is high.

The following describes a method performed by the exemplary apparatus of FIG. 5. The method reduces current consumed by the self-refresh operation by preventing BISH/BISL toggling in accordance with one embodiment of the present invention. When the m-th block is accessed, a check is made to determine whether the device is in self-refresh mode. If self-refresh signal SREF is low, as is normal, output signal BIS_CLPZ of the self-refresh and internal address detector 500 transitions high so that MSI latch 600 passes block selecting signal MSI to control the BISH/BISL.

Referring again to FIG. 7, when block selecting signal MSIL_LAT is low and block selecting signal MSIM_LAT is high, BISH and BISL transition to power voltage VPP and ground voltage VSS, respectively. At this point in self-refresh mode, whenever SREF is at an active low state, BISH/BISL toggling occurs such that the BISH/BISL associated with the other blocks are left unchanged.

In the self-refresh mode, when self-refresh signal SREF is high and the block is not selected (i.e., not changed), BISH/BISL toggling does not occur, and BISH and BISL levels are power voltage VPP and ground voltage VSS, respectively. At this time, output signal BIS_CLPZ of the detector 500 transitions low so that block selecting signal MSIL is output as MSI, and the BISH/BISL are left unchanged. Therefore, the current consumed during toggling between the power voltage VPP and the ground voltage VSS of the BISH/BISL is reduced.

As described above, in the self-refresh mode of the present invention, by toggling BISH/BISL when the internal addresses are all 0 following sequential increment of the word line, the self-refresh current can be reduced. In addition, because the BISH/BISL driver is disposed within the cross area between sense amplifier blocks, driving capability can be improved.

The above description is illustrative and not restrictive. Many variations of the invention will become apparent to those of skill in the art upon review of this disclosure. For example, the number of internal address lines may be more than 9 bits wide, such as W bits, to accommodate addresses beyond IAT<0> through IAT<W–1>. Additionally, the detector described herein may comprise any other logic that would permit toggling of BISH and BISL signals when the SREF and all of the internal address are at the same state. The scope of the invention should, therefore, be determined not with reference to the above description, but instead should be determined with reference to the appended claims along with their full scope of equivalents.

What is claimed is:

1. A semiconductor memory device designed to operate with reduced self-refresh current consumption having a cross area between a plurality of sense amplifier blocks, the device comprising:
    a self-refresh and internal address detecting means receiving a multiplicity of internal addresses and a self-refresh signal for generating an output signal determining whether bit line separation signals are to be toggled;
    a block selecting signal latching means for latching the output signal of the self-refresh and internal address detecting means and a block selecting signal;
    a bit line separation signal (BISH/BISL) controlling means receiving output signals of the block selecting signal latching means for generating the bit line separation signals; and
    a bit line separation driver controlled by the bit line separation signals,
    wherein the bit line separation driver is operably disposed in the cross area between at least two of the sense amplifier blocks.

2. The semiconductor memory device as recited in claim 1, wherein the self-refresh and internal address detecting means includes:
    a number of logic circuits for logically combining the multiplicity of internal addresses;
    a first logic circuit for logically combining the outputs of the number of logic circuits;
    a second logic circuit for logically combining the self-refresh signal and the output of the first logic circuit; and
    a plurality of inverters receiving the output of the second logic circuit for outputting the signal determining whether the bit line separation signals are to be toggled.

3. The semiconductor memory device as recited in claim 1, wherein the block selecting signal latching means includes:
    a first inverter for inverting the output of the self-refresh and internal address detecting means;
    a second inverter for inverting the output of the first inverter;
    a third inverter for inverting the block selecting signal;
    a transfer gate receiving the output signals of the first and the second inverters for selectively transferring the output signal of the third inverter; and
    a latching means for latching the output of the transfer gate.

4. The semiconductor memory device as recited in claim 1, wherein the bit line separation signal controlling means includes:
    a logic circuit for logically combining the block selecting signal and a peripheral circuit voltage;
    a first transistor having a gate terminal configured to receive the peripheral circuit voltage and a source terminal coupled to the output of the logic circuit;
    a second transistor having a source terminal and back gate terminal configured to receive a power voltage and a drain terminal coupled to the drain of the first transistor;
    a third transistor having a gate terminal coupled between the drain terminal of the first transistor and the drain terminal of the second transistor, the third transistor having a source terminal and a back gate terminal configured to receive the power voltage;
    a fourth transistor having a gate terminal coupled to the output at the logic circuit, a source terminal coupled to a ground voltage and a drain terminal coupled to the drain terminal of the third transistor; and
    an inverter coupled between the drain terminals of the third and fourth transistors for outputting the bit line separation signals.

5. A semiconductor memory device designed to operate with reduced self-refresh current consumption having a cross area between a plurality of sense amplifier blocks, the device comprising:
    a self-refresh and internal address detector coupled to receive a plurality of internal addresses and a self-refresh signal, and configured to generate an output signal determining whether bit line separation signals are to be toggled;
    a block selecting signal latch having a plurality of latch circuits coupled to latch the output signal of the self-refresh and internal address detector and a block selecting signal; and
    a bit line separation signal (BISH/BISL) controller coupled to receive output signals of the block selecting signal latch, and configured to generate the bit line separation signals.

6. The semiconductor memory device as recited in claim 5 further comprising a bit line separation driver controlled by the bit line separation signals, wherein the bit line separation driver is operably disposed in the cross area between at least two of the sense amplifier blocks.

7. The semiconductor memory device as recited in claim 5 wherein the plurality of latch circuits comprises a first latch and a second latch for latching the output signal of the self-refresh and internal address detector and the block selecting signal.

8. The semiconductor memory device as recited in claim 7, wherein each of the first latch and the second latch comprises:
    a first inverter for inverting the output of the self-refresh and internal address detector;
    a second inverter for inverting the output of the first inverter;
    a third inverter for inverting the block selecting signal;
    a transfer device receiving the output signals of the first and the second inverters for selectively transferring the output signal of the third inverter; and
    a latch configured to latch the output of the transfer gate.

9. The semiconductor memory device as recited in claim 8, wherein the transfer device comprises a first transistor and a second transistor coupled to form a transmission gate.

10. The semiconductor memory device as recited in claim 9, wherein the first transistor is a p-type field effect transistor and the second transistor is an n-type field effect transistor.

11. The semiconductor memory device as recited in claim 5, wherein the self-refresh and internal address detector comprises:
   a plurality of logic circuits configured to logically combine the internal addresses;
   a first logic circuit configured to logically combine the outputs of the plurality of logic circuits;
   a second logic circuit configured to logically combine the self-refresh signal and the output of the first logic circuit; and
   a plurality of inverters coupled to receive the output of the second logic circuit and configured to generate the signal determining whether the bit line separation signals are to be toggled.

12. The semiconductor memory device as recited in claim 11 wherein the plurality of logic circuits comprises at least first, second, and third logic gates.

13. The semiconductor memory device as recited in claim 12, wherein each of the first, second, and third logic gates comprises a NOR gate.

14. The semiconductor memory device as recited in claim 11 wherein the first logic circuit comprises a NAND gate.

15. The semiconductor memory device as recited in claim 11 wherein the second logic circuit comprises a NAND gate.

16. The semiconductor memory device as recited in claim 5, wherein the bit line separation signal controller comprises:
   a logic circuit configured to logically combine the block selecting signal and a peripheral circuit voltage;
   a first transistor having a gate terminal coupled to receive the peripheral circuit voltage and a source terminal coupled to the output of the logic circuit;
   a second transistor having a source terminal coupled to receive a power voltage and a drain terminal coupled to a drain terminal of the first transistor;
   a third transistor having a gate terminal coupled between the drain terminal of the first transistor and the drain terminal of the second transistor, the third transistor having a source terminal coupled to receive the power voltage;
   a fourth transistor having a gate terminal coupled to the output at the logic circuit, a source terminal coupled to a ground voltage and a drain terminal coupled to the drain terminal of the third transistor; and
   an inverter coupled between the drain terminals of the third and fourth transistors for outputting the bit line separation signals.

17. A method for reducing self-refresh current consumption in a semiconductor device having a memory device with a cross area between a plurality of sense amplifier blocks, the method comprising:
   receiving a plurality of internal addresses and a self-refresh signal at a self-refresh and internal address detector;
   generating at an output of the self-refresh internal address detector an output signal for determining whether bit line separation signals are to be toggled;
   receiving the output signal and a block selecting signal at a block selecting signal latch;
   generating at outputs of the block selecting signal latch output signals;
   receiving the output signals at a bit line separation signal (BISH/BISL) controller; and
   generating at outputs of the BISH/BISL controller the bit line separation signals.

18. The method of claim 17 further comprising controlling a bit line separation driver with the bit line separation signals, wherein the bit line separation driver is operably disposed in the cross area between at least two of the sense amplifier blocks.

19. The method of claim 17 wherein the block selecting signal latch includes a first MIS latch and a second MIS latch configured to generate the output signals of the block selecting signal latch, the output signals of the block selecting signal latch including an MSEL_LAT signal and an MSIM_LAT signal.

* * * * *